United States Patent [19]

Hansen

[11] Patent Number: 4,962,470
[45] Date of Patent: Oct. 9, 1990

[54] CRANKSHAFT PULSE POSITION DEVELOPING APPARATUS HAVING A SYNCHRONOUS DIGITAL FILTER

[75] Inventor: Mark C. Hansen, Kokomo, Ind.

[73] Assignee: Delco Electronics Corporation, Kokomo, Ind.

[21] Appl. No.: 227,975

[22] Filed: Aug. 1, 1988

[51] Int. Cl.⁵ .............................................. H03K 5/13
[52] U.S. Cl. .................................... 364/572; 324/160; 364/569
[58] Field of Search .......... 364/572, 565, 569, 431.05, 364/724.01; 371/6; 73/116; 328/165; 123/425

[56] References Cited

U.S. PATENT DOCUMENTS

| | | |
|---|---|---|
| 3,386,079 | 5/1968 | Wiggins . |
| 3,938,082 | 2/1976 | Schowe, Jr. . |
| 4,323,976 | 4/1982 | Radaelli et al. .................... 364/565 |
| 4,366,471 | 12/1982 | Kasuga ................................ 364/572 |
| 4,382,298 | 5/1983 | Evans ..................................... 371/6 |
| 4,456,992 | 6/1984 | Schaub ................................... 371/6 |
| 4,532,592 | 7/1985 | Citron et al. .................. 364/431.05 |
| 4,538,235 | 8/1985 | Henning .............................. 364/569 |
| 4,553,426 | 11/1985 | Capurka ................................ 73/116 |
| 4,578,755 | 3/1986 | Quinn et al. ....................... 364/569 |
| 4,686,483 | 8/1987 | Isshiki et al. ....................... 328/165 |
| 4,741,310 | 5/1988 | Yagi et al. .......................... 123/425 |
| 4,843,580 | 6/1989 | Ridoux et al. ..................... 364/569 |

Primary Examiner—Kevin J. Teska
Attorney, Agent, or Firm—C. R. Meland

[57] ABSTRACT

A digital system for providing a series of pulses that are related to the angular position of an engine crankshaft. A square wave signal is developed which is applied to the input of a synchronous digital filter. The digital filter provides a noise-immune output signal. The digital filter has two counters or timers which are used to determine whether or not the high and low times of the input signal that is applied to the filter exceed predetermined time periods. Based on this determination the filter ignores or passes pulses of the square wave to the output of the filter.

4 Claims, 2 Drawing Sheets

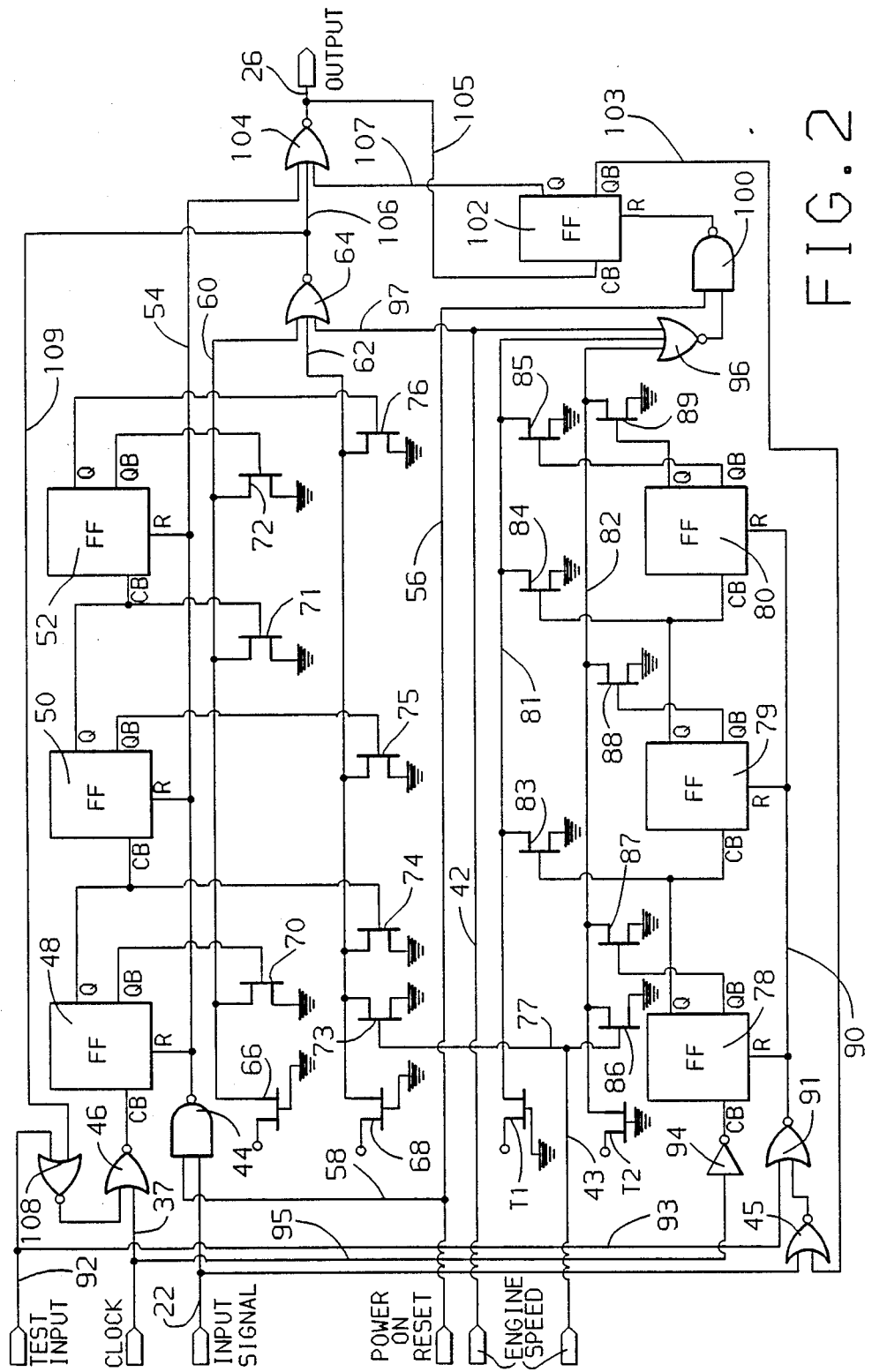

CRANKSHAFT PULSE POSITION DEVELOPING APPARATUS HAVING A SYNCHRONOUS DIGITAL FILTER

This invention relates to a digital system for providing digital pulses at certain positions of an engine crankshaft and more particularly to a digital system that has a synchronous digital filter to provide noise immunity.

When a magnetic pickup is used to detect crankshaft or camshaft position of an internal combustion engine the pickup coil may be subjected to magnetic fields that cause noise voltages to be developed. Thus, an unwanted voltage may be induced in the pickup coil which if processed will cause an error voltage to be developed. Where the voltage induced in the pickup coil controls the timing of an ignition system and where the ignition coil of the ignition system is located near the pickup coil the magnetic field developed by the coil may induce spurious signals. Further, the magnetic field developed by the ignition coil may cause noise problems in the digital electronics that responds to the voltage induced in the pickup coil and noise voltages can be developed in the digital electronics by various other noise sources.

An asynchronous digital filter for providing noise immunity for a type of system that has been described is disclosed in U.S. patent application Ser. No. 65,956, filed on June 24, 1987, now U.S. Pat. No. 4,843,580 granted on June 27, 1989. In that patent application a digital pulse developing system is disclosed that develops pulses at certain crankshaft positions which has a digital filter that is capable of ignoring voltage pulses that are caused by noise while passing valid pulses that are not caused by noise. The system monitors or measures time periods that correspond to the times that a digital signal is at a one or high level or at a zero or low level. The system determines whether valid one or valid zero levels have occurred by determining whether or not the time periods that the signal is high or low is longer than a predetermined time period. If the signal remains at a one level for longer than a predetermined period of time a valid one level is recognized or achieved. Likewise, if the signal remains at a low or zero level for longer than a predetermined period of time a valid zero level is recognized or achieved. When the digital signal has been at a valid one level and then goes low the system will process this falling edge immediately. The now existing zero level must then be held for the predetermined length of time before any subsequent logical one states are recognized.

The digital filter of the above-referenced patent application is capable of filtering out noise induced positive glitches, that is noise induced voltage pulses that begin with a zero to one level transition. Thus, a one level occurring after a valid zero state has been recognized must remain at a one level for the predetermined length of time before it is considered a valid one state, otherwise it is completely ignored.

The present invention is concerned with providing a digital filter of the type disclosed in the above-referenced patent application wherein the filter is implemented as a synchronous digital filter instead of an asynchronous digital filter of the type disclosed in the above-referenced patent application. By using synchronous circuitry for the digital filter the testing of the filter and in particular fault testing becomes much simpler as compared with asynchronous circuitry. In order to easily test a circuit, one must be able to control the timing events of the circuit. Since in a synchronous system the timing can be controlled by a system clock, the testing is much easier. Further, since timing can be controlled by a clock the logic circuitry of a synchronous system can be frozen in any desired logic state. Another advantage of synchronous circuitry, as opposed to asynchronous circuitry, is that synchronous circuitry can be more reliable and predictable since process variations in manufacturing the integrated semiconductor circuit, that make up the filter, do not effect the timing of the circuit. Thus, synchronous circuitry uses only a system clock to generate timing events whereas asynchronous circuitry use delay paths to generate timing events. These delay paths are provided by one-shot multivibrators which have RC circuits and the response of these RC circuits can vary with process variations.

It accordingly is an object of this invention to provide a digital filter that performs the functions described above that is implemented by synchronous circuitry.

Another object of this invention is to provide a digital filter that is capable of performing the functions described above wherein the filter has two digital timers or ripple counters that are utilized to determine whether or not an input signal to the digital filter has been respectively at valid high and low levels for predetermined periods of time.

IN THE DRAWINGS

FIG. 2 is a schematic circuit diagram of a digital filter which is shown as a block in FIG. 1.

Figure 1:
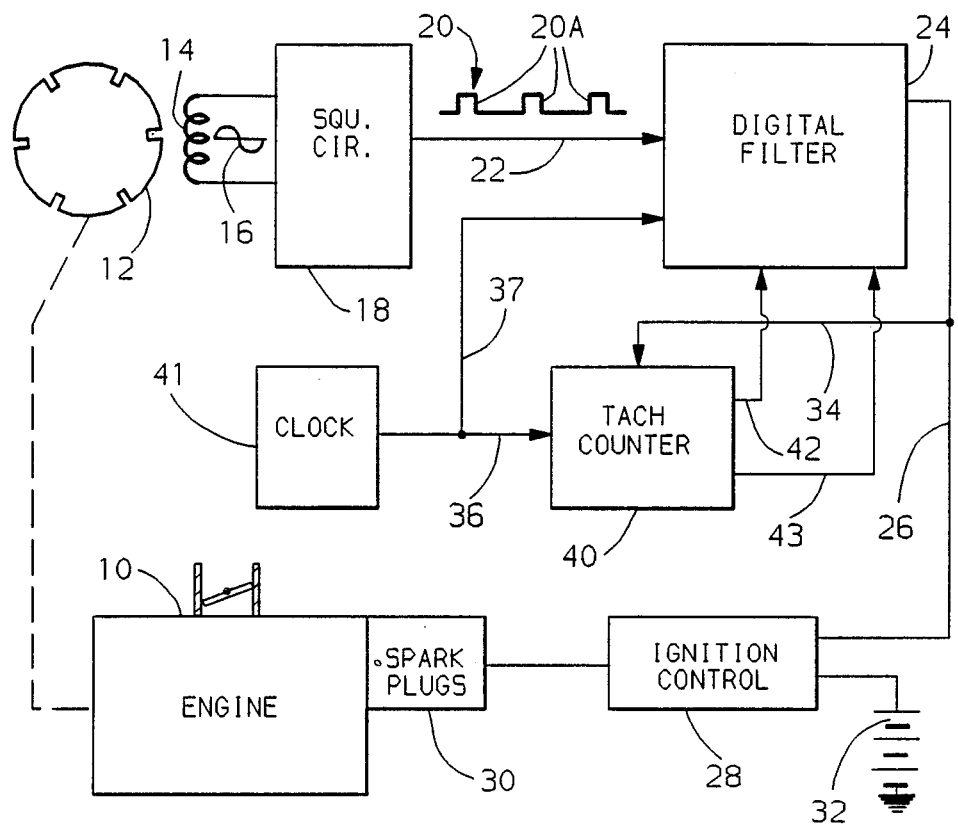
FIG. 1 illustrates an ignition system for an internal combustion engine that has a digital pulse developing system made in accordance with this invention.

Referring now to the drawings and more particularly to FIG. 1, an ignition system for an internal combustion engine is illustrated which utilizes the synchronous digital filter of this invention. In FIG. 1, the reference numeral 10 designates a spark-ignited internal combustion engine that has a crankshaft. The crankshaft drives a disk or wheel 12 which has six slots that are spaced by 60 degrees. The disk 12 forms part of a magnetic or variable reluctance pickup that has a pickup coil 14. When a slot passes the pickup coil 14 an alternating voltage designated as 16 is induced in coil 14. These alternating voltages occur at every 60 degrees of rotation of the crankshaft of the engine.

The alternating voltage 16 is applied to a squaring circuit 18 which has a zero crossing detector. The circuit 18 develops a square-wave voltage 20 that is applied to line 22. This square-wave voltage has one level to zero level transitions 20A (falling edges) that are spaced by 60 degrees. The line 22 is connected to a digital filter 24 which is illustrated as a block in FIG. 1. A detailed schematic of digital filter 24 is illustrated in FIG. 2. The output of digital filter 24 is applied to a line 26. As will be more fully described, the digital filter 24 operates to filter out noise induced voltage pulses that begin with a positive transition (zero level to one level). The filter also operates in such a manner that when the digital signal has been at a valid one level and then goes low the filter will process this falling edge immediately. When no noise induced transitions occur the falling edges or negative transitions of the square wave voltage on line 26 follows and is in phase with the falling edges of the input voltage on line 22.

The line 26 is connected to an ignition control circuit 28 which develops and controls the application of spark firing voltages to the spark plugs 30 of engine 10. The ignition control controls an inductive ignition system that has a plurality of ignition coils (not illustrated) that are connected to the spark plugs. The system is a known distributorless system wherein a secondary winding of an ignition coil is connected to two spark plugs which are fired in series. The falling edges or negative transitions of the square-wave voltage on line 26 are used to identify the correct ignition coil to be energized in order to correctly fire a given pair of spark plugs in synchronism with crankshaft position. Ignition control 28 is energized by a direct voltage source 32 of a motor vehicle which is illustrated as a battery. The battery is charged by a direct voltage charging system in a known manner. Direct voltage source 32 supplies the other electronic components of the system by connections which are not illustrated.

The square-wave output voltage on line 26 is applied to a Tach-Counter 40 by line 34. The Tach-Counter 40 receives clock pulses from a constant frequency clock pulse source 41 via line 36 which may have a frequency of 31.25 KHz. The Tach-Counter 40 counts clock pulses for 60 degree intervals to provide a count that represents engine rpm or speed. The counter 40, together with suitable logic circuitry (not illustrated) provides output signals on lines 42 and 43 that are a function of engine speed. The lines 42 and 43 are connected to the digital filter 24 and the logic state of lines 42 and 43, which is a function of engine speed, determines the magnitude of time periods that are used by the digital filter 24 in a manner that will be described. The clock pulse source 41 is connected to digital filter 24 by a line 37.

FIG. 2 illustrates the digital filter 24, shown as a block in FIG. 1, and it will now be described. In FIG. 2, the same reference numerals have been used as were used in FIG. 1 to identify corresponding lines or conductors. In FIG. 2 the input line 22, which has the square-wave voltage 20 applied thereto, is connected to NAND gate 44 and to a NOR gate 45.

The line 37, which is connected to clock 41, is connected to an input of NOR gate 46. The output of NOR gate 46 is connected to the CB input of a flip-flop 48. The Q terminal of flip-flop 48 is connected to the CB terminal of a flip-flop 50 and the Q terminal of flip-flop 50 is connected to the CB terminal of a flip-flop 52. The reset terminal R of flip-flops 48-52 are connected to a line 54 that is connected to the output of NAND gate 44. One of the inputs to gate 44 is connected to a power on reset line 56 via line 58. Flip-flops 48, 50 and 52 are all D-type flip-flops and flip-flops 48 and 50 have their D input tied to its QB output. Flip-flop 52 has its D input tied to the VDD supply (not illustrated).

The synchronous digital filter has logic control or decode lines 60 and 62. These lines are connected to inputs of a NOR gate 64. The lines 62 and 64 are energized with five volts via field effect transistors 66 and 68. The line 60 is connected to three fild effect transistors 70, 71 and 72. The drain-source circuits of transistors 70-72 are connected respectively between line 60 and ground so that when any of these transistors are biased conductive, line 60 is grounded or is placed at a low or zero logic level.

The line 62 is connected to four field effect transistors 73, 74, 75 and 76 and when any of these transistors are biased conductive, line 62 is grounded or is placed at a low or zero logic level.

The gate of transistor 70 is connected to the QB output of flip-flop 48. The gate of transistor 74 is connected to the Q output of flip-flop 48. The QB and Q outputs of flip-flop 50 are connected respectively to the gates of transistors 75 and 71. The QB and Q outputs of flip-flop 52 are connected respectively to the gates of transistors 72 and 76. The gate of transistor 73 is connected to a line 77 which in turn is connected to line 43.

As will be more fully described hereinafter, the flip-flops 48-52 operate as a three stage ripple counter.

The synchronous filter has another three stage ripple counter comprised of flip-flops 78, 79 and 80 which are connected together as shown in FIG. 2. Flip-flops 78 and 79 are the same as flip-flops 48 and 50 and flip-flop 80 is the same as flip-flop 52. Associated with flip-flops 78-80 are logic control or decode lines 81 and 82. The lines 81 and 82 are energized with five volts via field effect transistors T1 and T2. The line 81 is connected to three field effect transistors 83, 84 and 85. The drain source circuits of transistors 83-85 are connected respectively between line 81 and ground so that when any of these transistors are biased conductive, line 81 is grounded or is placed at a low or zero logic level.

The line 82 is connected to four field effect transistors 86, 87, 88 and 89 and when any of these transistors are biased conductive, line 82 is grounded or is placed at a low or zero logic level.

The Q and QB outputs of flip-flop 78 are connected respectively to the gates of transistors 83 and 87. The Q and QB outputs of flip-flop 79 are connected respectively to the gates of transistors 84 and 88. The Q and QB outputs of flip-flop 80 are connected respectively to the gates of transistors 89 and 85. The gate of transistor 86 is connected to line 77 and hence to line 43.

The reset terminals R of flip-flops 78-80 are connected to line 90. Line 90 is connected to the output of NOR gate 91. One of the inputs to gate 91 is connected to a line 92 via line 93. The other input to gate 91 is connected to the output of gate 45. The CB input of flip-flop 78 is connected to the clock line 37 via inverter 94 and line 95.

The decode lines 81 and 82 are connected to inputs of a NOR gate 96. The other input to gate 96 is connected to line 42 via line 97. Line 97 also connects an input of gate 64 to line 42.

The output of gate 96 is connected to an input of NAND gate 100. The other input of gate 100 is connected to power on reset line 56. The output of gate 100 is connected to the reset terminal R of a flip-flop 102. Flip-flop 102 is the same as flip-flop 52. The QB terminal of flip-flop 102 is connected to an input of gate 45 by line 103 and its CB terminal is connected to output line 26 by line 105. The Q output of flip-flop 102 is connected to one of the inputs of a NOR gate 104 by line 107. The output of gate 64 is connected to another input of gate 104 via line 106. The line 54 is connected to another input of gate 104. The output of gate 64 is connected to an input of NOR gate 108 via line 109. The other input of gate 108 is connected to line 92 and the output of gate 108 is connected to an input of gate 46.

Figure 3:
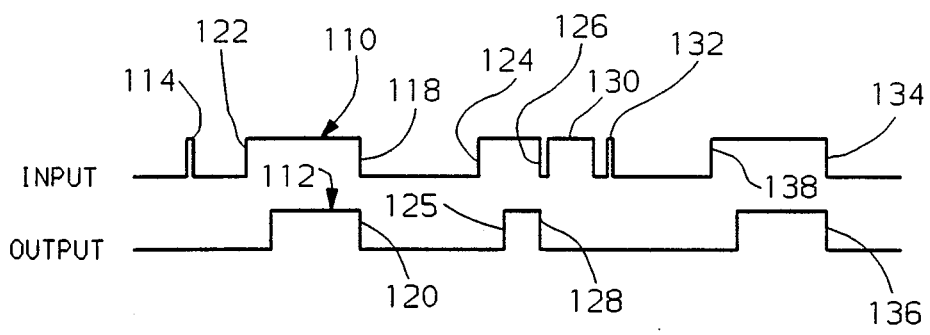
FIG. 3 illustrates waveforms that are useful in understanding this invention.

The operation of the synchronous digital filter shown in FIG. 2 will now be described. Before proceeding to a detailed description of the operation of the logic circuitry of FIG. 2, reference will be had to FIG. 3 which illustrates waveforms that are useful in understanding the operation of the circuit shown in FIG. 2. In FIG. 3, the input waveform, which is generally designated as 110, is a hypothetical waveform of a square-wave signal that could occur on input line 22. The output waveform of the digital filter on line 26 is depicted in FIG. 3 and generally designated as 112.

First of all, it can be seen in FIG. 3 that the filter 24 operates such that a positive going input signal, which has less than a predetermined high-time duration, will be ignored and hence will not appear at output line 26. Thus, it can be seen that positive going input pulse 114 has been ignored or in other words, produces no corresponding output transition in the output waveform 112. This is because the duration of time that pulse 114 was at a high level was less than a predetermined time. Pulse 114 represents a positive going noise pulse and it is filtered out as has been described.

The filter 24 operates such that any negative going transition of input waveform 110 will be acted upon with the output going low, provided that the negative going transition has been preceded by a valid high-time. A valid high-time means that the input signal has been at a high level for a predetermined period of time. Further, once a negative transition is acted upon, no further input changes or transitions will be recognized until a valid, predetermined low-time is seen. A valid low-time means that the input signal has been at a low level for a predetermined period of time. With this in mind, it can be seen in FIG. 3 that input waveform 110 has a negative going transition 118 and that the output follows this transition as designated by negative going transition 120. The reason that transition 120 is developed by the filter is that there has been a valid high-time preceding transition 118. A valid high-time means that the input waveform was at a high level for at least a predetermined duration of time preceding the negative transition 118. In this case, the waveform 110 was at a high level for the duration of time between transitions 122 and 118 and this duration of time is long enough to be considered a valid high-time.

Following transition 118, the input waveform makes a positive going transition 124. As mentioned above, when a negative transition occurs no further changes will be recognized until a valid, predetermined low-time is seen. In the case of waveform 110 the low-time is the duration of time between transitions 118 and 124. This low-time is assumed to be greater than a valid predetermined low-time and accordingly there is an output transition in output waveform 112 designated as 125.

When negative input transition 126 occurs, a corresponding negative transition 128 occurs in the output. This is because transition 126 was preceded by a valid high-time. Subsequently occurring input pulses 130 and 132 are both ignored because they were not preceded by a valid low time. The pulse 130 meets the high time requirement but since the low time requirement has not been met, the output stays low. The pulse 132 would not make the output go high even if a previously valid low time were attained since its high time is too short. When negative going transition 134 occurs, a corresponding transition 136 occurs in the output. This is because transition 134 was preceded by a valid high-time corresponding to the time duration between transitions 138 and 134.

The filtering action of the digital filter is dependent upon engine speed. At engine speeds above 4000 rpm there is no filtering action. Thus, at engine speeds above 4000 rpm the Tach-counter 40 causes line 42 to go high which causes the output of gate 64 to be held low and flip-flop 102 is kept reset. As a result of the foregoing, the decode lines are bypassed and the output signal on line 26 follows the input signal on line 22.

At engine speeds below 2000 rpm the output of Tach-counter 40 causes line 42 to go low and line 43 to go high. The high level signal on line 43 and hence on line 77 causes transistors 73 and 86 to be biased conductive thereby respectively connecting lines 62 and 82 to ground. This disables decode lines 62 and 82. Decode lines 60 and 81 are enabled.

At engine speeds between 2000 rpm and 4000 rpm the output of Tach-counter 40 causes both lines 42 and 43 to go low. When line 43 goes low, both transistors 73 and 86 are biased nonconductive so that decode lines 62 and 82 are enabled. Decode lines 60 and 81 are also now enabled.

Assume that engine speed is below 2000 rpm so that decode lines 62 and 82 are disabled and decode lines 60 and 81 are enabled. Assume further that the input signal on line 22 is low. The signal on the R inputs of flip-flops 48-52 will now be high which will keep or maintain the flip-flops in a reset condition. In this reset condition the flip-flops are reset to a zero count and cannot be clocked by the clock pulses on line 37 while in the reset condition. When the input signal subsequently goes high, the reset signal to the flip-flops goes low and the flip-flops will now start counting clock pulses from line 37. Thus, the fact that the R terminals went low allows the flip-flops to be clocked by the clock pulses. Decode line 60 will stay low until transistors 70-72 have all been biased nonconductive. This occurs when the three stage ripple counter comprised of flip-flops 48-52 has counted up to a preset count magnitude of five clock pulses which corresponds to a time period of about 119 to 171 microseconds. This is the valid high-time period. When the preset count magnitude has been counted, a decode has been reached and decode line 60 will then go from a low level to a high level. This forces the output of gate 64 to go from high to low which allows the output of gate 104 to go high. Once a decode is reached, the output of gate 64 feeds back to gate 46 via line 109 and gate 108 to terminate the supply of clock pulses to flip-flop 48 thereby maintaining the outputs of flip-flops 48-52 at the decode count. This allows the output on line 26 to go and stay high. If the high-time of the input signal had been less than the time needed to reach the decode (five clock pulses) the output of gate 64 would remain high and the output signal on line 26 would remain low. Therefore, any positive-going noise, like pulse 114 of FIG. 3, would not be passed to the output while the filter is enabled. Further, if the input signal went low before the decode time has elapsed (no valid high-time) the flip-flops are reset to zero count and remain reset until the input signal subsequently goes high.

The operation of flip-flops 78-80 and associated circuitry will now be described, assuming again that engine speed is below 2000 rpm. When the output on line 26 is high, any negative transition in the input signal on line 22 will cause the output to go low. This low going transition on the output will clock the flip-flop 102 to a high state which in turn maintains the output of gate 104 in a low state. The Q output of flip-flop 102 on line 107 will remain high until a valid low is seen.

When the QB output of flip-flop 102 on line 103 is low and the input signal on line 22 is low, the flip-flops 78–80 will be clocked by the clock pulses from clock 41 via lines 36 and 95 and inverter 94. The flip-flops can be clocked because then R terminals are low. Decode line 81 will stay low until transistors 83–85 have all been biased nonconductive. This occurs when the three stage ripple counter, comprised of flip-flops 78–80, has counted up to a preset count magnitude of four clock pulses. When this preset count magnitude has been counted, a decode has been reached and decode line 81 then goes from a low state to a high state. When line 81 goes high, the output of gate 96 will go low and the output of gate 100 will go high, resetting flip-flop 102. The output on line 26 will then be allowed to go high the next time a valid high is seen.

From the foregoing it can be seen that flip-flops 48–52 and associated circuitry operates as a timer which causes a decode line to change its state (low to high) whenever a predetermined time period has elapsed. The same is true of flip-flops 78–80 which also operate as a timer. In the case of flip-flops 48–52, the predetermined time period corresponds to five clock pulses and in the case of flip-flops 78–80, the predetermined time period corresponds to four clock pulses. Further, flip-flops 48–52 determine the high time duration of time and flip-flops 78–80 determine the low time duration of time. Putting it another way, flip-flops 48–52 preset the valid high time and flip-flops 78–80 preset the valid low time.

If the input signal on line 22 goes high at any time before a valid low is seen, the flip-flops 78–80 will be reset. These flip-flops will then start counting again from zero as soon as the signal on line 22 goes low again. Until a decode count is reached with the signal on line 22 low, the signal on output line 26 will be held low by flip-flop 102. Therefore, any negative-going noise on the input will be acted upon but until a valid low is seen, no further high or low transitions will occur at output line 26.

The operation of the system, when engine speed is between 2000 rpm and 4000 rpm, is generally the same as that described for operation below 2000 rpm. However, with engine speed between 2000 and 4000 rpm, all four decode lines 60, 62, 81 and 82 are enabled. Flip-flops 48–52 are so connected that a decode for line 62 will occur after two clock pulses have been counted. Flip-flops 78–80 are so connected that a decode for line 82 will occur after three clock pulses have been counted. It therefore can be seen that a decode signal will be developed on line 62 (two clock pulses) before a decode signal is developed on line 60 (five clock pulses). Further, a decode signal will be developed on line 82 (three clock pulses) before a decode signal is developed on line 81 (four clock pulses). It therefore can be seen that when engine speed is between 2000 rpm and 4000 rpm, both the valid high time and valid low time has been decreased as compared to operation below 2000 rpm. The valid high time has been decreased from a time corresponding to five clock pulses to a time corresponding to two clock pulses. The valid low time has been decreased from a time corresponding to four clock pulses to a time corresponding to three clock pulses.

The system of this invention, as has been described, uses two timers or counters provided respectively by flip-flops 48–52 and 78–80. The advantage of this arrangement is that the decode times of the two timers can be different. This allows the decode times to be selected so that they can accommodate the particular waveform of the input signal. In this regard, it is pointed out that the system disclosed in the above-referenced patent application Serial No. 65,956, uses only one timer or counter so that the high time decode time and the low time decode time must be the same.

It has been previously pointed out that line 56 is a power-on reset line. When the circuitry is powered-up the line 56 is held low by circuitry which has not been illustrated. This resets the seven flip-flops that are used in the circuit of FIG. 2. The line 56 is then brought high and it stays high until another power-up sequence is needed.

The line 92 is a test input line and it is held low during operation of the system. When it is desired to test the circuit of FIG. 2, the line 92 is brought to a high level. The circuit can then be stepped through its sequential counting and logic switching as the clock pulses from clock 41 are applied to the circuit. The clock pulses can be terminated or stopped to freeze the logic in a desired state.

At the expense of some reiteration, the following summarizes the operation of the synchronous digital filter shown in FIG. 2.

1. A positive going input signal on input line 22, with less than a predetermined high-time duration, will be ignored and accordingly will not be passed to output line 26.

2. A negative going input signal on input line 22, that has been preceded by a valid high-time duration signal on line 22, will be acted upon with the output signal on line 26 going low but no further input changes on input line 22 will be recognized until a valid, predetermined low-time has occurred.

As previously mentioned, the digital filter is a synchronous digital filter and as such only the system clock 41 is used to generate timing events. Thus, the control logic circuit is driven by flip-flops or timers 48–52 and 78–80 which in turn are clocked by clock 41. Further, the system of this invention does not use any circuit elements that provide delay paths such as the one-shot multivibrators 44 and 47 that are used in the asynchronous system disclosed in the above-referenced patent application.

The embodiments of the invention in which an exclusive property or privilege is claimed are defined as follows:

1. A digital system for providing a series of voltage pulses that occur at predetermined angular connections of a crankshaft of an internal combustion engine comprising, sensor means including means driven by said crankshaft for developing a square wave signal that has a plurality of high level pulses that occur at predetermined angular positions of the crankshaft separated by low level periods, the spacing between corresponding edges of said pulses corresponding to a predetermined amount of angular rotation of said crankshaft, synchronous digital filter means having an input coupled to said sensor means and an output, said digital filter means comprising a first pulse counter for determining whether or not the time periods of said high level pulses exceed first predetermined time periods and a second pulse counter for determining whether or not the time periods of said low level periods exceed second predetermined time periods, means coupled to said counters for preventing a high level voltage pulse of said square wave signal from being passed to said output when said high level voltage pulse has a time period that was determined to be less than said first predetermined time period, means coupled to said counters for passing a high to low level transition of said square wave to said output when just prior to said transition said square wave had a high level period that was longer than said first predetermined time period, and means coupled to said counters for preventing an input transition from being passed to said output when a high to low level transition has occurred and a subsequent input transition occurs at a duration of time after the high to low transition occurred that is less than said second predetermined time period.

2. The digital system according to claim 1 where both pulse counters are connected to a source of constant frequency clock pulses.

3. The digital system according to claim 1 where said first and second predetermined time periods are not the same.

4. The digital system according to claim 1 where said first pulse counter is coupled to a first decode line and said second pulse counter is coupled to a second decode line and wherein signals are developed on said decode lines when a respective counter counts-up to a predetermined count magnitude.

* * * * *